(12) United States Patent
Waeckerle et al.

(10) Patent No.: US 7,583,173 B2
(45) Date of Patent: Sep. 1, 2009

(54) NANOCRYSTALLINE CORE FOR A CURRENT SENSOR, SINGLE AND DOUBLE-STAGE ENERGY METERS AND CURRENT PROBES CONTAINING THEM

(75) Inventors: Thierry Waeckerle, Nevers (FR); Fabien Simon, Crosne (FR); Francisco Alves, Champigny-sur-Marne (FR); Thierry Save, Coulanges les Nevers (FR); Alain Demier, Varennes Vauzelles (FR)

(73) Assignee: Imphy Alloys, Puteaux (FR)

( * ) Notice: Subject to any disclaimer, the term of this patent is extended or adjusted under 35 U.S.C. 154(b) by 0 days.

(21) Appl. No.: 11/666,697

(22) PCT Filed: Oct. 26, 2005

(86) PCT No.: PCT/FR2005/002686

§ 371 (c)(1),
(2), (4) Date: Nov. 16, 2007

(87) PCT Pub. No.: WO2006/048533

PCT Pub. Date: May 11, 2006

(65) Prior Publication Data

US 2008/0117014 A1  May 22, 2008

(30) Foreign Application Priority Data

Oct. 29, 2004 (FR) .................................. 04 11618

(51) Int. Cl.
  H01F 27/24 (2006.01)
(52) U.S. Cl. ..................................... 336/233
(58) Field of Classification Search ................. 336/212, 336/233, 234; 148/100, 561
See application file for complete search history.

(56) References Cited

U.S. PATENT DOCUMENTS 6,563,411 B1  5/2003  Otte et al.
2003/0041931 A1*  3/2003  Sunakawa et al. ........... 148/561

FOREIGN PATENT DOCUMENTS

EP  0 563 606 A  10/1993

(Continued)

*Primary Examiner*—Tuyen Nguyen
(74) *Attorney, Agent, or Firm*—Sughrue Mion, PLLC

(57) ABSTRACT

A nanocrystallised tape-wound core without a localised air-gap, consisting of a nanocrystalline material with the following atomic composition: $[Fe_{1-a}Ni_a]100\text{-}x\text{-}y\text{-}z\text{-}a\text{-}\beta\text{-}\gamma Cu_x Si_y B_z Nb_a M'_\beta M''_\gamma$, wherein $a \leq 0.3$, $0.6 \leq x \leq 1.5$, $10 \leq y \leq 17$, $5 \leq z \leq 14$, $2 \leq a \leq 6$, $\beta \leq 7$, $\gamma \leq 8$, M' is at least one of the elements V, Cr, Al and Zn, M" is at least one of the elements C, Ge, P, Ga, Sb, In and Be, with a permeability μ of 200 to 4000, a saturation of more than 1T, an induction range, in which the permeability does not vary by more than 5%, of more than 0.9T, a remanent induction of less than 0.02T and a cut-off frequency higher than 1 MHz, such that μ varies by less than 1% when the core is aged for 100h at more than 100° C., μ varies by less than 5% when the core is coated, μ varies by less than 15% when the temperature is in the range of −25° C. and +60° C., and by less than 25% when the temperature is in the range of −40° C. and +120° C., and μ varies in a monotonic and substantially linear manner with a temperature of −40° C. to +120° C.

15 Claims, 7 Drawing Sheets

FOREIGN PATENT DOCUMENTS

| | | | |
|---|---|---|---|
| FR | 2 823 507 A | | 10/2002 |
| JP | 01079342 A | * | 3/1989 |
| JP | 03271346 A | * | 12/1991 |
| WO | WO 03/067615 A | | 8/2003 |
| WO | WO 2004/088681 A | | 10/2004 |

* cited by examiner

NANOCRYSTALLINE CORE FOR A CURRENT SENSOR, SINGLE AND DOUBLE-STAGE ENERGY METERS AND CURRENT PROBES CONTAINING THEM

The invention relates to a magnetic core used for the manufacture of an inductive component of the current sensor type.

In the case of components or current sensors and in particular for alternating current sensors which may possibly include a significant superimposed direct current component it is necessary to have cores of reduced permeability in order not to saturate the core, without however this being too weak to preserve satisfactory measurement accuracy for the sensor. Sensor performance must be stable in high polarisation fields and over as wide a temperature range as possible, and in some cases over a wide frequency range.

Such current sensors are in particular used in electrical energy metering transformers, which isolate all devices in the powered load system and provide an electrical signal used for metering energy at the same time.

A current transformer which can be directly connected to the load current (of type 1 according to standard IEC 1026. Throughout the document whenever reference is made to this standard the reference refers to the previous edition closest to the 30, Oct. 2004) comprises a single stage which takes the form of the core combining the functions of both transformer-isolator and current sensor for metering energy. As may be seen in FIG. 1, such a transformer, identified in general by 1 in FIG. 1, generally comprises three parts:

a toric magnetic circuit (not directly visible in the figure) to minimise magnetic losses,
a primary winding 2 of $N_1$ turns of resistance $R_1$ often leading to a single conductor passing through the core ($N_1$=1) through which a current $i_1$ passes,
a secondary winding 3 of $N_2$ turns of resistance $R_2$ (generally of the order of 2500) through which a current $i_2$ passes.

A current sensor is of satisfactory accuracy for metering energy if the phase offset between the current and voltage is very small, and if the relationship between the primary and secondary currents is as linear as possible. This is achieved in particular through a magnetising inductance $A_L$ which is as high as possible, and this implies that a very large number of secondary turns $N_2$ are available, and also that permeability $\mu$ is also as high as possible. In fact, whether or not there is a direct current component $I_{DC}$ superimposed on the alternating current $I_1$ which has to be measured, the combination of these currents must not bring the core close to the saturation zone because otherwise the B-H relationship will no longer be at all linear. If the induction range over which the B-H relationship is approximately linear is called $\Delta B$, the critical field which must not be exceeded is then $\Delta B/\mu max$, otherwise saturation will occur, and the resulting non-saturation condition is as follows:

$$I_{max}=|(I_{CC}+I_1)|<N_1 \cdot (\Delta B/\mu_{max}).$$

This means that the more the maximum permissible current which has to be measured, $I_{max}$, increases, the more the permeability of the material must be reduced in order to avoid saturation.

In practice, for small measurement ratings (5 to 50 A according to the standard) on which direct current components may possibly be superimposed, a single-stage sensor structure and a magnetic core of amorphous cobalt-based alloy are used.

For load current ratings over 50 A on which direct current components may be superimposed the standard recommends a double stage structure as illustrated in FIG. 2, with a leading current transformer identified in general by 4 which is responsible for isolating and eliminating the direct current component similar to that in the previous case, and a high sensitivity current sensor identified in general by 5 branched off the transformer. As the latter prevents all risk of sensor saturation there is every advantage in using a magnetic core of very high permeability.

Another standard application of these current sensors is current control for active power components (IGBT, GTO, thyristors, etc.) in medium and high power devices. This type of application requires that the sensor should be able to measure currents which vary very quickly and frequently over time, and therefore that it should have a broad measurement dynamic covering the widest possible frequency measurement range, typically at least 1 MHz. The most powerful sensor is that which has maximum accuracy and measurement dynamic for the smallest physical size.

In such equipment double stage structures similar to that which has just been described are used with a low equivalent permeability leading current transformer and a branched current sensor based on a high permeability magnetic core with great frequency stability such as a conventional high permeability nanocrystalline core ($\mu$>20,000).

The performance required from the cores of current sensor transformers exposed to either strong superimposed direct current components (energy meter applications) or large and rapid changes in current (harmonic measurement applications, such as current probes for the control of active power components) are essentially the same and can be summarised as follows:

The core of the inductive component must have good magnetic properties with good thermal stability, which in particular will help to push up the limiting operating temperature of the component and provide a measurement accuracy which is not greatly dependent on operating temperature. This temperature stability is typically of the order of a variation in permeability of the order of a few % between −40° C. than +60° C.

It must also show little ageing in atmospheres which might exceed 100° C.

The permeability of the magnetic core in alternating fields must be limited to a permeability level such that the material will not be saturated through the joint effect of the fundamental alternating component and any harmonics which it may have (in the case of power supply to a power semiconductor) and any superimposed direct current component. For use in a transformer used in an energy meter a relative magnetic permeability of less than 4000 is more particularly preferred, preferably less than 3000 while still above 200, or even 300.

The magnetic arrangement used must not incorporate any localised air gap, in order to limit sensitivity to a parasitic electromagnetic radiation. This will also make it possible to avoid the need to use screening.

It is also necessary to find a saturation induction Bs which is high, so that the sensor can be miniaturised and/or its accuracy improved. In particular cores having a saturation induction Bs which is higher than or equal to 1 T, or even higher than 1.2 T are preferred.

In the case of current transformers which are intended to work with a superimposed direct current component it is desirable to have "strong B-H linearity", that is say a relationship between B and H which is as linear as possible over a significant induction of range $\Delta B$; a maximum variation in $\mu$ of at most a few % over this range is envisaged. In fact, the higher $\Delta B$ is for a constant polarisation current range $I_{DC}^{max}$, the more the permeability and therefore the accuracy of the sensor can be increased or the more the radius and volume of the core can be decreased.

It is desirable to have an effective local permeability $\mu_{loc}$ with an alternating current component which is as independent as possible of the superimposed direct current component $H_{DC}$. The derivative of B with respect to H at the operating point B(H) is called the differential permeability or local permeability $\mu_{loc}$.

The core must also have small magnetic losses in order to limit the phase shift between the sensor's current and voltage, and therefore increase accuracy.

It is also desirable that the magnetic properties of the inductive components should not be very sensitive to external stresses, such as the stresses caused by coating, winding.

In addition to this, the magnetisation frequency dynamic should be satisfactory, that is to say the frequency of the "high intrinsic cut-off" should be high, and more particularly equal to at least 1 MHz without screening of the sensor. In the context of this invention the frequency at which the maximum amplitude of $\mu"$, the imaginary part of the permeability complex representing the dissipative effects of induced currents, is called the cut-off frequency of a conducting material.

The core must be as economical as possible.

In order to construct current transformers it is common to use toric magnetic cores of Fe Ni alloy containing 80% nickel, but these alloys have a relative permeability which varies appreciably with the polarising field, while always remaining well above 10,000. They are therefore unsuitable for current transformers operating with a strong direct current component.

It has been suggested, in particular in U.S. Pat. No. 6,507,262 B1, that an iron-based nanocrystalline alloy of the Fe Co Cu Si B type which may not contain cobalt, having a high permeability between 12,000 and 300,000, should be used. Likewise it has been suggested that a cobalt-based amorphous alloy having a comparable permeability should be used. These two arrangements, which have the advantage of having very linear B-H relationships, have the disadvantage that they have very high permeabilities which lead to saturation of the magnetic cores when the direct current component of the current which has to be measured reaches a few amperes.

It has also been suggested that metal cores of cobalt-based amorphous alloy having a relative permeability of several thousand adjusted by annealing in a transverse field be used. These alloys, which have the advantage of having a permeability which is not too high, nevertheless have the disadvantage that they have a saturation induction of less than 0.8 Tesla, which is not favourable to obtaining satisfactory accuracy from the sensor. Furthermore, these alloys are sensitive to ageing above 100° C., and cobalt is a very expensive element.

It has also been suggested that a nanocrystalline Fe Co Nb Si B Cu containing 60% (atomic) of Co which can be used to regulate the permeability up to values of a few hundreds or a few thousands while retaining some of the advantages of nanocrystalline Fe Cu Nb Si B alloys, namely the temperature stability of performance, low remanence and low coercive field, should be used. These alloys nevertheless have the disadvantage that they have a low saturation induction and contain a great deal of cobalt, which is very expensive.

Finally it has been suggested that current transformers without a magnetic core (Rogowski sensors) or having magnetic cores made of ferrite pots should be used. These sensors have the disadvantage that they are very sensitive to external magnetic fields, which disturb measurements. In order to avoid these disturbances it is necessary to provide very expensive magnetic screening.

It seems that none of the known arrangements are really satisfactory.

The object of this invention is therefore to provide a wound ferromagnetic core which is improved in relation to those in the prior art and which has in particular a relative magnetic permeability, without an air gap, which can be accurately adjusted between 200 and 4000, capable of satisfying the needs of current probes for energy meters, either directly connected to a single-stage structure or connected to a current transformer with a double stage structure, and also capable of satisfying the needs of current probes for dynamic current monitoring of the active components of electronic systems, and of doing this while occupying the smallest possible volume without the need for screening, and of being as economical as possible.

For this purpose the invention relates to a wound nanocrystalline core without a localised air gap comprising a nanocrystalline material having the atomic composition:

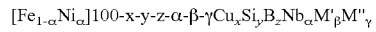

with a≦0.3, 0.6≦x≦1.5, 10≦y≦17, 5≦z≦14, 2≦α≦6, β≦7, γ≦8, M' being at least one of the elements V, Cr, Al and Zn, M" being at least one of the elements C, Ge, P, Ga, Sb, In and Be, having a permeability $\mu$ of between 200 and 4000, a saturation of more than 1 T, an induction range in which the permeability does not vary by more than 5% higher than 0.9 T, a remanent induction of less than 0.02 T and a cut-off frequency above 1 MHz, and such that $\mu$ varies by less than 1% when the core is subjected to 100 hours ageing at more than 100° C., $\mu$ varies by less than 5% when the core is coated, $\mu$ varies by less than 15% when the temperature varies between −25° C. and +60° C., and less than 25% when the temperature varies between −40° C. and +120° C., and such that $\mu$ varies regularly and almost linearly with temperature between −40° C. and +120° C.

Permeability $\mu$ may vary uniformly and almost linearly with temperature between −100° C. and +120° C.

In a preferred embodiment the nickel content is less than 4.5%, which has the advantage of resulting in a very low magnetostriction coefficient λs.

In another preferred embodiment, the wound core according to the invention has a composition such that, in atoms %:

Ni≦4.5%

0.8%≦Cu≦1.2%

2.5%≦Nb≦3.5%

12%≦Si≦16.5%

6%≦B≦9% the remainder being iron and impurities.

Preferably, the wound core has a permeability $\mu$ of more than 1000.

The core according to the invention has the advantage of being very economical because it does not contain cobalt.

Furthermore, its effective local permeability is very close to its linear permeability. In fact the inventors have found that this effective local permeability $\mu_{loc}$ is closer to the permeability $\mu_{lin}$ corresponding to the gradient of a major hysteresis cycle the smaller the remanence of the hysteresis cycle. Thus cores having a very low remanence Br, typically less than 0.02 T, will be preferred.

A second object of the invention comprises an electrical measuring device of the energy meter type or of the current probe type comprising at least one magnetic core, at least one magnetic core being a nanocrystalline core without an air gap according to the invention.

The electrical measurement device is for example a single-stage energy meter according to standard IEC 1036 for ratings below 50 A comprising one magnetic core according to the invention whose permeability $\mu$ is between 1000 and 4000, and is preferably less than 3000.

In a preferred embodiment the single-stage energy meter does not incorporate screening.

The electrical measurement device may also be a double stage energy meter comprising a current transformer core and a measurement core according to standard IEC 1036 for ratings above 50 A in which the current transformer core is a core according to the invention whose permeability $\mu$ is between 200 and 1000, and is preferably less than 800.

The electrical measurement device may also be an energy meter according to standard IEC 1036 for ratings above 50 A, having a single-stage and comprising a core according to the invention whose permeability $\mu$ is between 200 and 1000, and preferably below 800.

Preferably an energy counter according to the invention is capable of measuring a current incorporating a strong direct current component.

Finally the electrical measurement device may be a current probe having a broad measurement dynamic to monitor currents in active power components in medium or high power devices of the type comprising a current transformer core and a measurement core, the current transformer core being a core according to the invention whose permeability $\mu$ is between 200 and 1000, and is preferably less than 800.

The magnetic core according to the invention is particularly suitable for use in a current transformer intended to measure an alternating electric current on which a large direct current component is superimposed and/or harmonic components of all kinds and of various amplitudes.

This nanocrystalline core comprises the strip of nanocrystalline material wound on itself, in the form of a toric coil, obtained from a strip cast in an amorphous condition having the atomic composition:

$$[Fe_{1-\alpha}Ni_\alpha]100\text{-}x\text{-}y\text{-}z\text{-}\alpha\text{-}\beta\text{-}\gamma Cu_x Si_y B_z Nb_\alpha M'_\beta M''_\gamma$$

with a≦0.3, 0.6≦x≦1.5, 10≦y≦17, 5≦z≦14, 2≦α≦6, β≦7, γ≦8, M' being at least one of the elements V, Cr, Al and Zn, M" being at least one of the elements C, Ge, P, Ga, Sb, In and Be. In order to obtain the nanocrystalline structure the amorphous strip is subjected to annealing with crystallisation under tension in the unwound state, travelling and tensioned in a substantially axial longitudinal direction of the strip in such a way that the strip is held at an annealing temperature of between 500 and 700° C. for a period of between 5 and 300 seconds under an axial tensile stress, after which the nanocrystalline strip is wound, in which the axial tensile strength is between 2 MPa and 500 MPa in order to obtain a magnetic permeability of between 200 and 4000, and preferably of between 400 and 3000 for the applications envisaged.

Reference may be made to application FR 2 823 507 for further details of the annealing process under tension.

In general, the alloys used for the manufacture of amorphous iron-silicon strips have the following atomic composition:

$$[Fe_{1-\alpha}Ni_\alpha]100\text{-}x\text{-}y\text{-}z\text{-}\alpha\text{-}\beta\gamma Cu_x Si_y B_z Nb_\alpha M'_\beta M''_\gamma$$

with a≦0.3, 0.6≦x≦1.5, 10≦y≦17, 5≦z≦14, 2≦α≦6, β≦7, γ≦8,

M' being at least one of the elements V, Cr, Al and Zn,

M" being at least one of the elements C, Ge, P, Ga, Sb, In and Be.

These alloys may in particular have the following composition by weight:

$Fe_{72\ to\ 77}Cu_1 Nb_3 Si_{12.5\ to\ 17}B_{6\ to\ 12}$, the balance of the alloy being essentially inevitable impurities.

The material is prepared in liquid form and then cast at a high cooling rate in conventional cooled cylinder type casting equipment for amorphous strips so that a wound amorphous strip in the form of a coil with joined turns is obtained at the outlet from the casting equipment.

During treatment, within the furnace and more particularly in the zone of the furnace having a uniform temperature, the travelling strip undergoing treatment is subjected to a tensile force in its longitudinal axial direction which is perfectly adjusted in relation to the characteristics of the amorphous strip and controlled within a narrow range during the treatment of the strip as it passes through the furnace.

Furthermore, the strip which is obtained and wound at the outlet from flash annealing can be unwound and then rewound, which makes it possible to produce magnetic cores whose turns are isolated from each other, as will be explained below. In all circumstances flow-through heat treatment or flash annealing is carried out under tension with a precise value of the tensile force, at a well-defined temperature and a set speed of movement.

More generally, depending upon the characteristics of the strip and the temperature of the furnace between 600° C. and 700° C., and preferably between 620° C. and 690° C., the residence time for the strip at the annealing temperature may be between 5 and 300 seconds, and preferably between 10 and 60 seconds.

It is possible to determine a calibration curve for the value of the tension in order to obtain a specified permeability level between 200 and 4000 in the strip.

However, in order to obtain a core in which the circulation of induced currents and magnetic losses are limited it is necessary to prevent electrical contacts from forming between the turns when the annealed core is wound. Depending upon the envisaged applications for the core, to reduce the induced currents in the core and magnetic losses it may be necessary to deposit or form an electrically insulating layer on the strip to isolate the successive turns from each other. A mineral substance may for example be continuously deposited onto the strip, after annealing, in a thickness of between to one tenth of a micrometre and several micrometres. In order to do this it is possible to unwind the strip from the coil obtained at the outlet from the annealing equipment and to rewind it under a little mechanical tension possibly depositing an electrically insulating material onto the unwound strip prior to rewinding in such a way as to isolate the successive turns in the core from each other.

In general the crystallisation conditions of the strip within the dynamic annealing furnace under tension are such that the strip comprises at least 50% by volume of nanocrystals of a size between 2 and 20 nm. The various crystals are separated from each other by the matrix comprising the fraction of the alloy which remains amorphous.

The magnetic core according to the invention has the advantage that it has a low magnetostriction coefficient. Because of this its magnetic properties are unchanged when coating, impregnation, winding, adhesive bonding, etc., operations which give rise to stresses on the core are performed. Thus, for example, when a core according to the invention is coated its linear permeability varies by less than 5%, especially when measured at 20° C.

The magnetic core may be round, oval or square without an air gap.

Figure 4:
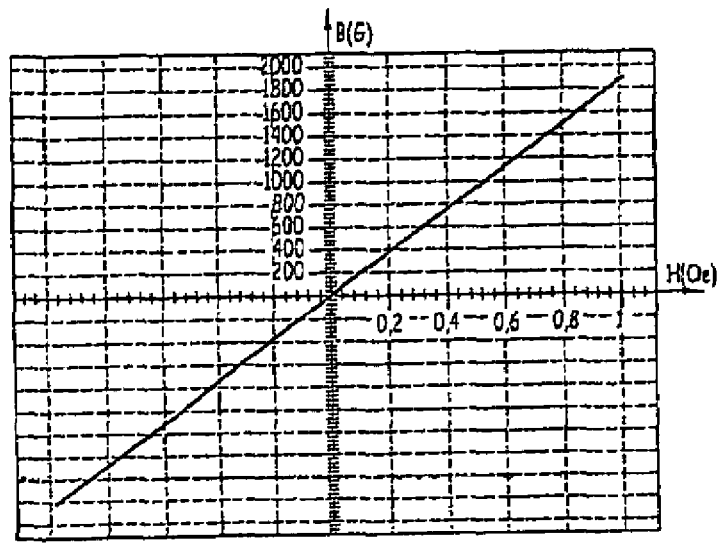

By way of example, crystallisation as nanocrystals was carried out in the amorphous matrix of an amorphous strip of composition $Fe_{73.5}Cu_1Nb_3Si_{15.5}B_7$ using the process already known, applying a tension of 50 Mpa during passage between the unwinder and the winder with a passage through the part of the furnace at 655° C. lasting 35 seconds. The amorphous strip was pre-insulated by passage through a bath of magnesium methylate. After rewinding into a torus of internal diameter 20 mm, characterisation by a direct current flux metering method showed (FIG. 4) that the hysteresis cycle at saturation (maximum applied field 20 Oe) is very linear in the part corresponding to a field from 6 to 7 Oe; thus if the maximum applied field (alternating and/or direct) is restricted to below 6 or 7 Oe, such as for example 1 Oe, the material only works in an extremely narrow linear hysteresis cycle (FIG. 4) corresponding to the ideal for a current sensor.

Figure 5:
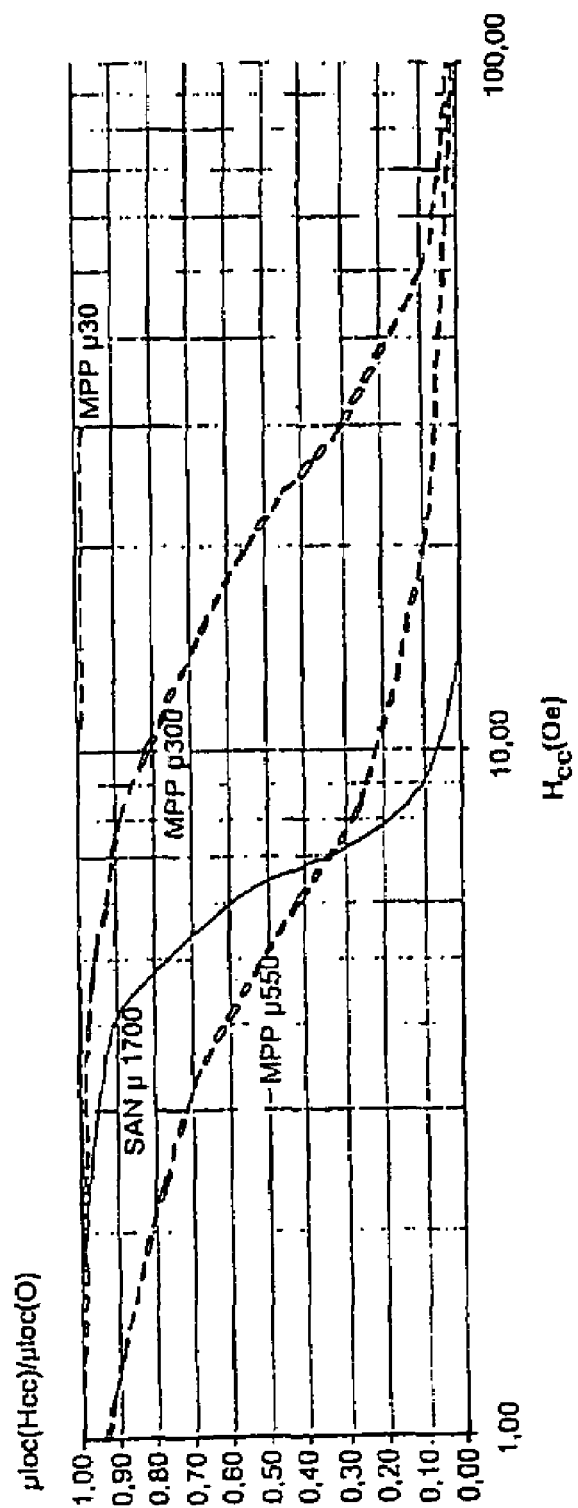
FIGS. 5 and 6 are graphs showing the ratio of magnetic permeability for a current (or field H) having a direct current component (or a corresponding field $H_{DC}$ in the case of FIG. 6 or 7) which is not zero to the magnetic permeability for a current (or field H) having a zero direct current component for different materials.
Figure 6:
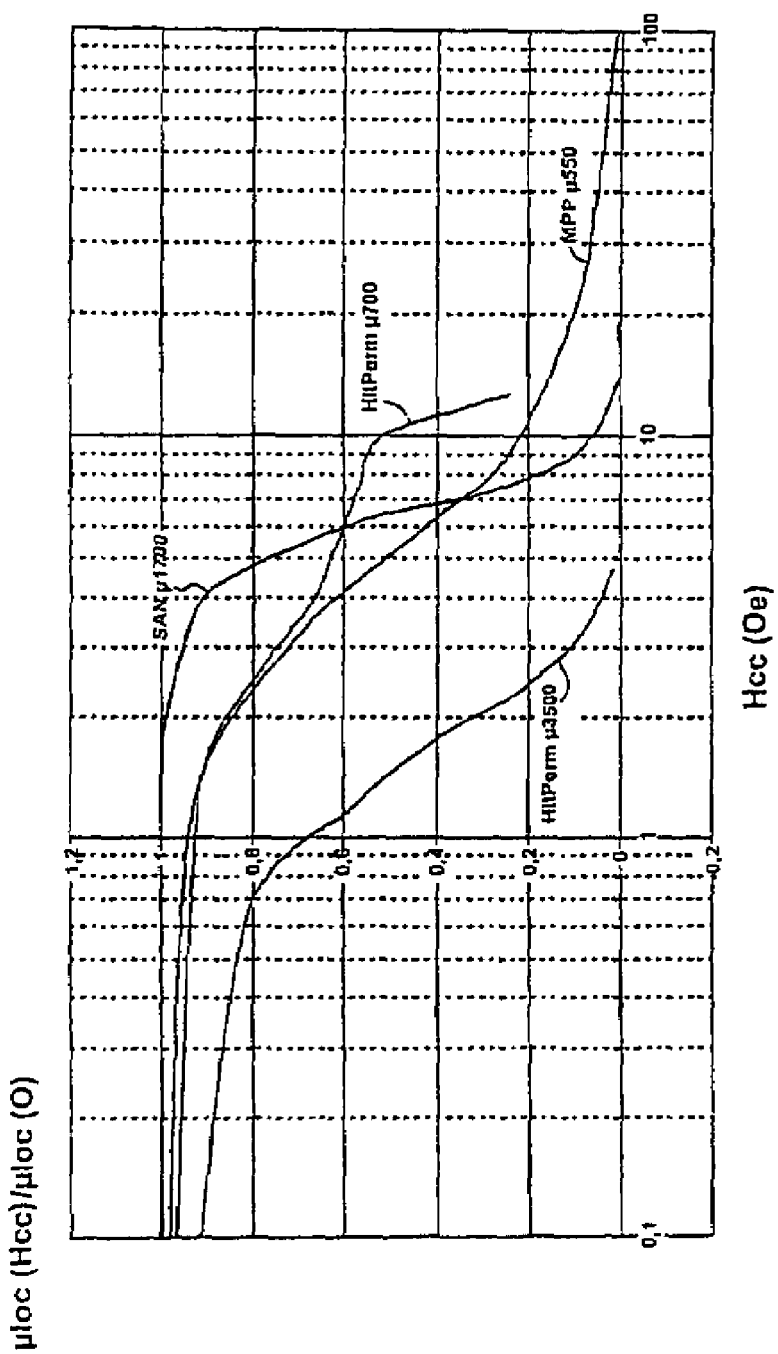

The remanence is so low that it is difficult to give it a value of other than 0, to within the limits of the accuracy of measurement. There is however no doubt that it is less than 0.02 T. The coercive field of 21 mOe is also very low and suggests that the local permeabilities $\mu_{loc}$ (also referred to as differential permeabilities) measured at 10 kHz with a superimposed direct current component Hdc will be very close to $\mu_{lin}$ and very stable in relation to Hdc. This is confirmed by the graphs shown in FIGS. 5 and 6 in which it will be seen by comparison with compacted FeNi powders (MPP) and cobalt-based crystalline alloys (Hitperm), that the permeability of the cores according to the invention (SAN) remains very much more stable when similar permeability levels are compared.

These graphs showing the ratio between the local permeability $\mu_{loc}(H_{dc})$ for a superimposed direct current field $H_{dc}$, and the local permeability $\mu_{loc}(0)$ for a superimposed direct current field of 0 in relation to the superimposed direct current field $H_{dc}$ for different materials characterised by their linear permeability $\mu_{lin}$ show that:

- for a core according to the invention having relative linear permeability of 1700 (SAN μ1700), the $\mu_{loc}(H_{dc})/\mu_{loc}(0)$ ratio remains effectively equal to 1 for a field $H_{dc}$ of up to approximately 2 Oe,
- for μ700 and μ3500 Hitperm cobalt-based nanocrystalline alloys, the $\mu_{loc}(H_{dc})/\mu_{loc}(0)$ ratio falls below 0.9 when the $H_{dc}$ field reaches 0.1 Oe,
- for compact FeNi powders, the $\mu_{loc}(H_{dc})/\mu_{loc}(0)$ ratio only remains stable for samples corresponding to low permeabilities (μ300 MPP and μ30 MPP), and for relative permeability of 550 (μ550 MPP), the ratio $\mu_{loc}(H_{dc})/\mu_{loc}(0)$ degrades very quickly.

Figure 1:
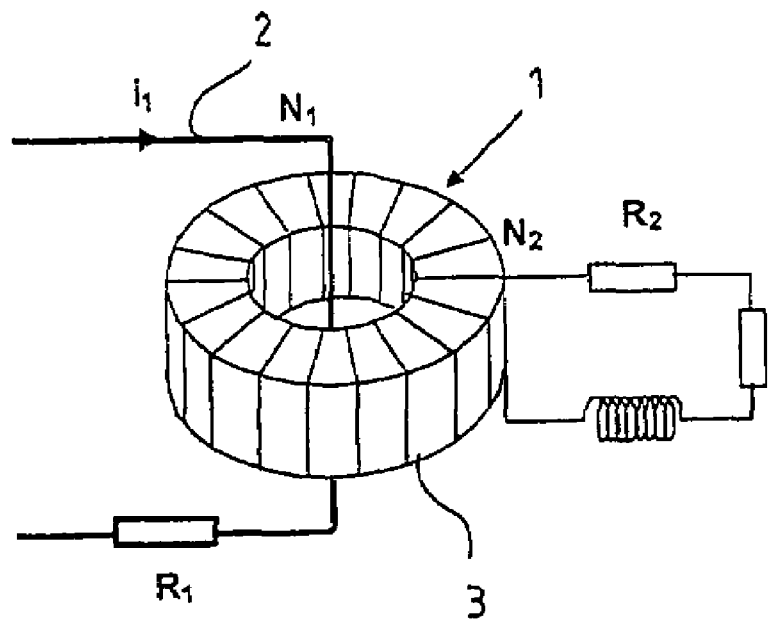
FIG. 1 is an outline diagram of a single-stage energy meter.
Figure 2:
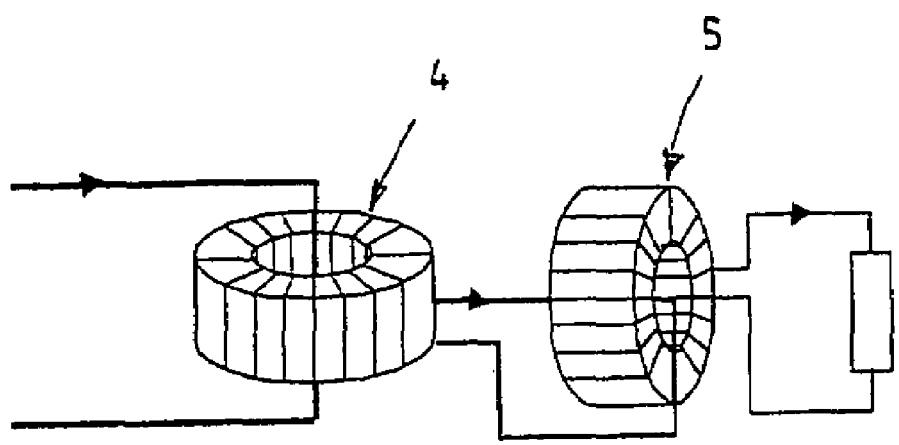
FIG. 2 is an outline diagram of a double stage energy meter.
Figure 3:
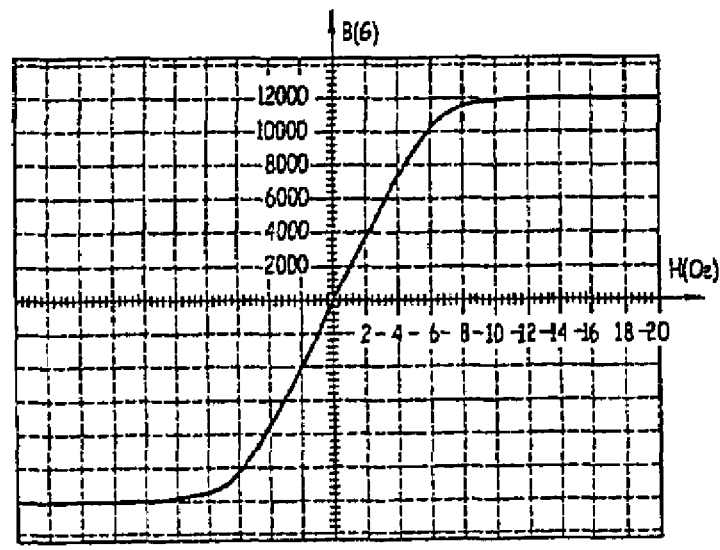
FIG. 3 and FIG. 4 are diagrams showing the saturation hysteresis cycle (H max=20 Oe) and linear hysteresis cycle (H max=1 Oe) of a core respectively.

This very favourable behaviour is directly due to the satisfactory linearity of the B-H hysteresis cycle as long as the saturation corner is not reached, as may be seen in FIG. 1 which represents a hysteresis cycle. The remanence $B_r$ is very low, $\mu_{loc}=\mu_{lin}$ and therefore $\mu_{loc}$ is independent of $H_{dc}$, which is ideal for the application.

Figure 7:
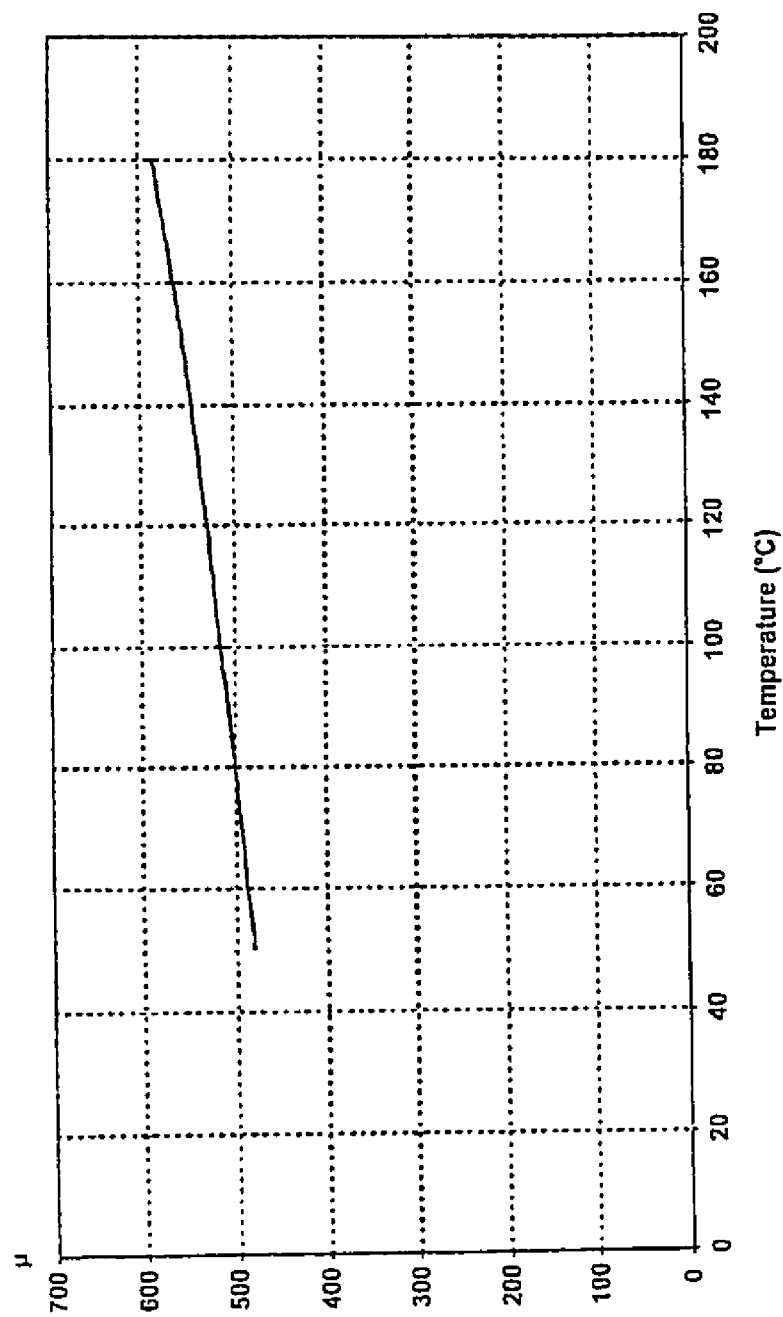
FIG. 7 is a graph showing the permeability of the core according to the invention in relation to temperature.

It will be seen in FIG. 7 that the relative variation of permeability $\mu_{lin}$ between 20° C. and 100° C. does not exceed 10.

Figure 8:
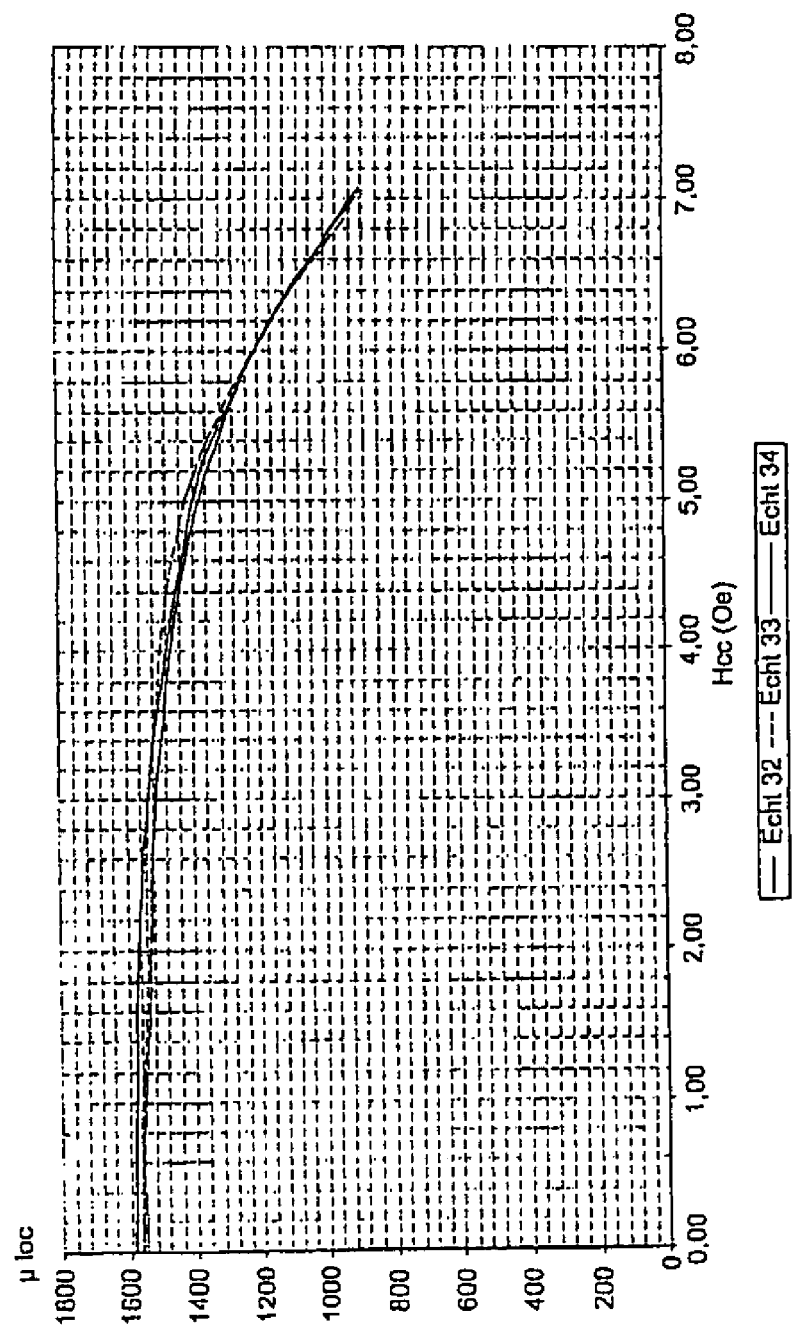
FIG. 8 shows graphs (permeability/amplitude of the superimposed direct current component) for three cores made from the same amorphous strip.

In order to evaluate the reproducibility of the manufacturing process three nanocrystalline cores were made according to the invention using the same starting amorphous strip and the same tension of 50 Mpa when winding. As FIG. 8 shows, the differences in characteristics between the three cores remain less than 5%.

In all the magnetic permeability of the core according to the invention varies by less than 15% when the temperature varies between −25° C. and +60° C., which is the maximum operating temperature range for most energy metering applications. By way of comparison a conventional cobalt-based amorphous core varies by 16%.

| The case of cores wound with $\mu_{lin} \approx 1700$ | The core according to the invention | Cobalt-based amorphous core |
|---|---|---|
| $[\mu_{lin}(T) - \mu_{lin}(20° C.)]/\mu_{lin}(20° C.)$ as % between −25° C. and +60° C. | −7%/+6% | −15%/+1% |
| $[\mu_{lin}(T) - \mu_{lin}(20° C.)]/\mu_{lin}(20° C.)$ as % between −40° C. and +120° C. | −8%/+17% | −15%/+1% |

Some applications need to function at up to 120° C. In this case performance becomes more favourable for cobalt-based amorphous cores.

Figure 9:
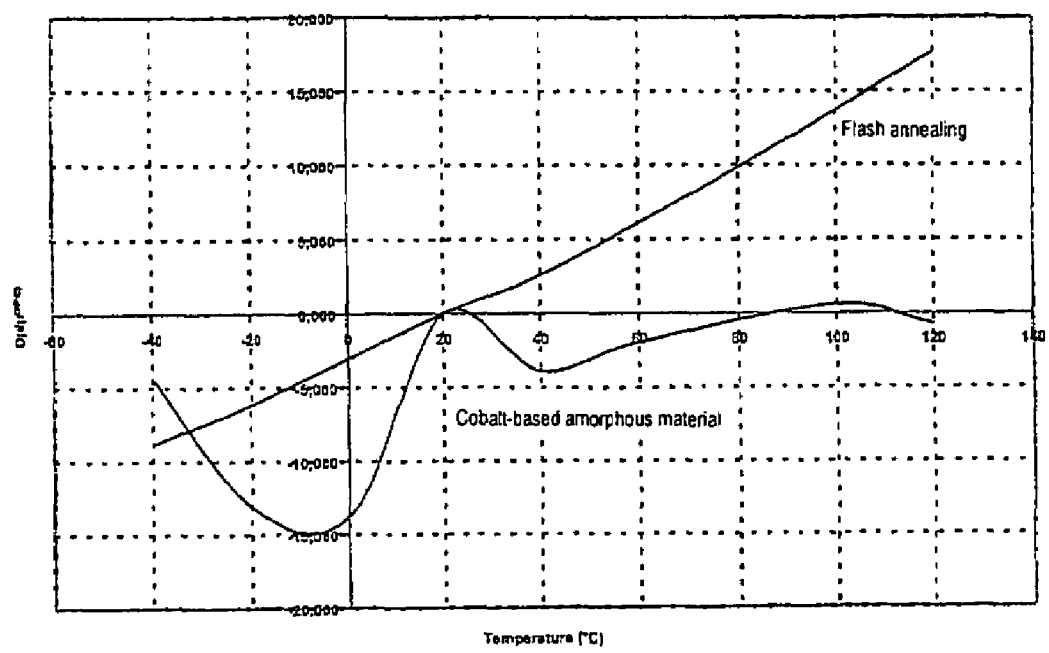
FIG. 9 shows stability μ as a function of temperature for a flash annealed core according to the invention and for a cobalt-based amorphous core.

Conversely, the cores according to the invention have the great advantage over cobalt-based amorphous cores that permeability changes regularly and almost linearly with temperature, which means it is easy to apply an electronic correction to the measurement as a function of temperature, whereas this is very much more difficult in the case of cobalt-based amorphous cores. This may be seen in particular in FIG. 9.

Furthermore, the inventors have found that the approximately linear change in permeability with temperature can be observed down to −100° C. In particular, measured differences between permeability at temperature T and 0° C. have yielded the following results:

| | T ° C. | | | | | |
|---|---|---|---|---|---|---|
| | 0 | −20 | −40 | −60 | −80 | −100 |
| Δμ/μ as % | 0 | −0.8 | −2.1 | −3.6 | −5.4 | −7.3 |

Furthermore, the core according to the invention suffers very little ageing through the effect of temperature. Thus a fall in linear permeability of less than 1% has been measured at 20° C. after 100 hours stoving at 120° C. By comparison a cobalt-based amorphous core would see its permeability drop by 5 to 6% under the same conditions.

It will be seen from the table below that linearities of better than 5 or 2% can be guaranteed for cores according to the invention over induction fields of the order of 1 T. It will also be seen that for the same linearity the core according to the invention offers an operating induction range which is approximately 10% greater than a cobalt-based amorphous core.

| Wound cores with $\mu_{lin} \approx 1700$ | Core according to the invention | Cobalt-based amorphous core |
|---|---|---|
| Accessible ΔB for $\Delta\mu_{loc}/\mu_{loc} < 2\%$ | $\Delta B_{max} = 1.06$ T | $\Delta B_{max} = 0.94$ T |
| Accessible ΔB for $\Delta\mu_{loc}/\mu_{loc} < 5\%$ | $\Delta B_{max} = 1.12$ T | $\Delta B_{max} = 1.03$ T |

Finally it will be noted that the cut-off frequency for the material according to the invention (corresponding to the frequency at which the maximum amplitude of the imaginary permeability μ" measured on an impedance meter is obtained) is higher than 2 MHz, that is twice the cut-off frequency of a cobalt-based nanocrystalline alloy (Hitperm) whose permeabilities of 590 and 2860 flank that of the material according to the invention as shown by the table below. The dynamic stability of the cores according to the invention is therefore very satisfactory, and because of this they are very suited to use in double stage current capture-devices of the current probe type.

| Material | μ' (10 kHz) | Frequency $f_c$ $f_c$ (Max μ") |
|---|---|---|
| Hitperm | 590 | 1 MHz |
| | 2860 | 2 MHz |
| Invention | 1560 | 2 MHz |

Furthermore, the intrinsic cut-off frequency may reach 10 MHz or more in the case of lower permeabilities.

The induction of the core at saturation Bs may be more than 0.9 Tesla and even 1 Tesla, even 1.2 Teslas. By comparison a cobalt-based amorphous core would not achieve a saturation of 1 T.

Furthermore, the inventors have investigated the effect of nickel and cobalt, which is an element whose effects are comparable to those of nickel, on the properties of the alloys to which this invention relates.

For an alloy whose composition in atoms % is $(Fe_{100-x-y}Co_xNi_y)_{74}Cu_1NB_3Si_{15}B_7$, the table below provides the accessible permeability range for heat treatment according to the invention, the coercive field Hc, the magnetostriction coefficient $\lambda_s$, the permeability ratio at 150° C. and 25° C., and the magnetic losses at 500 kHz for an induction of 50 mT at 27° C.

| x | y | μ range accessible | Hc (A/m) | $\lambda_s$ (in ppm) | μ(150° C.)/ μ(25° C.) | Magnetic losses at 500 kHz, 50 mT, 27° C. (in mW/cm³) |
|---|---|---|---|---|---|---|
| 0 | 0 | 4000 to 200, or even less | 3 | $-0.5 < \lambda_s < +0.5$ | 1.2 | 230 |
| 1.7 | 0 | μ > 300 | 4 | 0.8 | 1.4 | 480 |
| 4.9 | 0 | μ > 600 | 6 | 1.3 | 1.5 | 1225 |
| 2 | 1 | μ > 350 | 4.5 | 1 | 1.45 | 610 |
| 2.2 | 3 | μ > 400 | 4.8 | 1.5 | 1.6 | 780 |

It will be seen from this table that in particular the lower the sum of the nickel and cobalt concentrations the lower will be the magnetostriction coefficient as an absolute value.

More generally, the inventors have found that when the sum of the nickel and cobalt concentrations remains below 5%, and better 4%, the magnetostriction coefficient remained below 2 ppm as an absolute value, and could even be less than 1 ppm.

This property is particularly useful because the sensitivity of the alloy to external stresses (adhesive bonding, coating, impregnation, cutting-out, handling, etc.) is lower the lower the magnetostriction coefficient.

In principle the alloy used for this invention does not contain any cobalt, essentially for reasons of economy. However, because of the conditions of manufacture the alloy may contain a little cobalt as a trace, that is to say in concentrations below 0.5%.

Under these conditions, in order to obtain cores which have very little sensitivity to the stresses produced during manufacture it is preferable that the nickel content should remain below 4.5%, and better below 4% and even better below 3%.

In the case of a current probe the core according to the invention can reduce the size of the probe by 80 to 98%, as a result of its high saturation and its optimised permeability without air gap, as a result of its cut-off frequency exceeding 1 MHz, which a great advantage in control systems for power components.

EXAMPLE

Miniaturisation of a Double Stage Transformer

A double stage current transformer according to the invention was built on the basis of the following specifications:
Lower cut-off frequency: 100 Hz-3 dB
Upper cut-off frequency: 10 MHz-3 dB
Measurement frequency range: harmonics between 100 Hz and 10 MHz
Measurement range: 50 DC+50 AC: alternating load current 50 A+superimposed 50 A direct current.

A transformer according to the prior art was built on the basis of the same specifications using a conventional first stage ferrite with a localised air gap, whereas the transformer according to the invention was built using a low permeability nanocrystalline first stage.

The magnetic and dimensional characteristics of the transformers obtained are shown in the following table, in which:

|  | Configuration according to the invention | | Configuration according to the prior art | |
| --- | --- | --- | --- | --- |
|  | Core 1 1st stage | Core 2 2nd stage | Core 3 1st stage | Core 4 2nd stage |
| Ae(m²) | 0.40 | 0.24 | 3.15 | 0.22 |
| $L_e$(cm) | 4.5 | 2.4 | 16 | 6.3 |
| Volume (cm³) | 2.376 | | 51.786 | |
| $B_s$ (Tesla) | 1.25 | 1.25 | 0.3 | 0.25 |
| $A_L$ | 183 nH | 50 µH | 318 nH | 72 µH |
| Material | Nanocrystalline according to the invention (µ = 200) | Conventional nanocrystalline (Imphy T45-6) | MnZn ferrite core with localised air gap | Conventional nanocrystalline (Imphy T45-6) |
| Number of turns | 22 | 22 | 15 | 33 |
| Resistance of the wire | 68 mΩ | 5 Ω | 46 mΩ | 5 Ω |

Ae: cross-section of the core,
Le: mean perimeter,
Volume: sum of the volumes of the 2 magnetic cores,
AI = *Ae/Le.

It will therefore be seen that the use of nanocrystalline compounds according to the invention makes it possible to reduce the volume of the double stage transformer by a factor of 25 in comparison with transformers of the prior art incorporating a ferrite core with a localised air gap. Furthermore, such a transformer does not require the use of screening.

The invention is not restricted to the embodiment described.

Thus the construction of nanocrystalline cores using many alloys as defined above containing iron, silicon, an amorphising element and other additional elements whose temperature and stressing conditions during annealing can be adjusted to values other than those indicated, these values being nevertheless within the ranges claimed, can be envisaged.

The cores made may be circular, square or oblong.

After being nanocrystallised in order to obtain an apparent magnetostriction at saturation of close to zero, the cores produced can be coated with a protective resin directly onto the metal instead of a protective box, without any risk of disturbing the magnetic performance required for a current sensor as already described.

The inventors have discovered as a novel feature that such cores can very advantageously be used to manufacture transformer cores for alternating current sensors and more particularly for sensors having the following specific configurations and applications:

a single-stage energy meter core complying with the specifications of standard IEC 1036 for the smallest current ratings in low frequency energy metering (max 50 A), with in particular the ability to withstand strong superimposed direct current components and/or strong superimposed harmonic components, having no localised air gap for screening, having no cobalt, being as accurate as a cobalt-based amorphous core, possibly a little less stable than a cobalt-based amorphous core at temperatures below 60° C. but very much easier to correct, ageing very much less than a cobalt-based amorphous core above 100° C., and suitable for sensors which are at least also compact, a current transformer core for an energy meter having a double stage structure (charge currents in excess of 50 A on which direct current and/or harmonic components may possibly be superimposed) requiring an even smaller permeability range than previously, namely µ>1200, which it is currently impossible to obtain without a localised air gap (outside the scope of cobalt-based amorphous cores) and currently achieved with cut iron, FeSi or ferrite cores which gives rise to both high hysteresis and great sensitivity to external electromagnetic disturbances, which may make costly and bulky screening necessary, an energy meter core constructed in an innovative way as a single-stage structure thanks to low permeability (typically <1200) and strong B-H linearity prior to saturation (Δµ/µ<1% for ΔB=1 T) of the core according to the invention, and thus replacing the double stage structure of energy meters for load current ratings in excess of 50 A upon which direct current and/or harmonic components may be superimposed. It should be noted that this innovation is not limited to the advantageous replacement of current transformers—it replaces both the isolating transformer and the high permeability measurement core (thanks to a core with a very low permeability; thus changing from a double stage to a single stage structure), current probes having a broad measurement dynamic for current monitoring in active power components (IGBT, GTO, thyristors, etc.) in mean and high power devices. For this equipment double stage structures with a leading current transformer having low equivalent permeability and a derivative current sensor based on a high permeability core and high frequency stability such as a conventional nanocrystalline core (µ>20,000) are used for such equipment.

With these cores it is possible to manufacture corresponding sensors which have the advantage in comparison with known sensors that result directly from the advantages of the cores.

The invention claimed is:

1. A wound nanocrystallised core without a localised air gap comprising a nanocrystalline material of atomic composition:

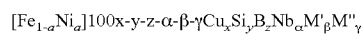

$$[Fe_{1-a}Ni_a]100x\text{-}y\text{-}z\text{-}\alpha\text{-}\beta\text{-}\gamma Cu_x Si_y B_z Nb_\alpha M'_\beta M''_\gamma$$

with a≦0.3, 0.6≦x≦1.5, 10≦y≦17, 5≦z≦14, 2≦α≦6, β≦7, γ≦8, M' being at least one of the elements V, Cr, Al and Zn, M" being at least one of the elements C, Ge, P, Ga, Sb, In and Be having a permeability µ is greater than 1000 and less than or equal to 4000, a saturation of more than 1 T, an induction range in which the permeability does not vary by more than 5% higher than 0.9 T, a remanent induction of less than 0.02 T and a cut-off frequency above 1 MHz, and such that µ varies by less than 1% when the core is subjected to 100 hours ageing at more than 100° C., µ, varies by less than 5% when the core is coated, µ varies by less than 15% when the temperature varies between −25° C. and +60° C., and less than 25% when the temperature varies between −40° C. and +120° C., and in that µ varies regularly and almost linearly with temperature between −40° C. and +120° C.

2. A wound core according to claim 1, wherein µ varies regularly and almost linearly with temperature between −100° C. and +120° C.

3. A wound core according to claim 1, wherein the nickel content is less than 4.5%.

4. A wound core according to claim 3, wherein the composition of the nanocrystalline alloy is such that, in atoms %:

$0.8\% \leq Cu \leq 1.2\%$ $2.5\% \leq Nb \leq 3.5\%$ $12\% \leq Si \leq 16.5\%$ $6\% \leq B \leq 9\%$ the remainder being iron and impurities.

5. An electrical measuring device of the energy metering type or current probe type comprising at least one magnetic core, characterised in that at least one magnetic core is a nanocrystalline core without a localised gap according to claim 1.

6. A device according to claim 5, further comprising a single-stage energy meter according to standard IEC 1036 for ratings below 50 A, in which the nanocrystalline magnetic core has a permeability μ greater than 1000 and less than 3000.

7. A device according to claim 6, wherein the device does not comprise screening.

8. A device according to claim 6, wherein the device is capable of measuring a current comprising a strong direct current component.

9. An electrical measuring device of the energy metering type or current probe type comprising two magnetic cores, wherein at least one magnetic core is a wound nanocrystallised core without a localised air gap comprising a nanocrystalline material of atomic composition:

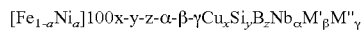

with $a \leq 0.3$, $0.6 \leq x \leq 1.5$, $10 \leq y \leq 17$, $5 \leq z \leq 14$, $2 \leq \alpha \leq 6$, $\beta \leq 7$, $\gamma \leq 8$, M' being at least one of the elements V, Cr, Al and Zn, M" being at least one of the elements C, Ge, P, Ga, Sb, In and Be, the nickel content being less than 4.5%, having a permeability μ of between 200 and 1000, a saturation of more than 1 T, an induction range in which the permeability does not vary by more than 5% higher than 0.9 T, a remanent induction of less than 0.02 T and a cut-off frequency above 1 MHz, and such that μ varies by less than 1% when the core is subjected to 100 hours ageing at more than 100° C., μ, varies by less than 5% when the core is coated, μ varies by less than 15% when the temperature varies between −25° C. and +60° C., and less than 25% when the temperature varies between −40° C. and +120° C., and in that μ varies regularly and almost linearly with temperature between −40° C. and +120° C.

10. The device according to claim 9, wherein the composition of the nanocrystalline alloy is such that, in atoms %:

$0.8\% \leq Cu \leq 1.2\%$ $2.5\% \leq Nb \leq 3.5\%$ $12\% \leq Si \leq 16.5\%$ $6\% \leq B \leq 9\%$ the remainder being iron and impurities.

11. The device according to claim 9, further comprising a double stage energy meter comprising a current transformer core and a measuring core according to standard IEC 1036 for ratings over 50 A, in which the current transformer core is a nanocrystalline core whose permeability μ is between 200 and 1000.

12. The device according to claim 9, wherein the device constitutes a current probe having a broad measurement dynamic to monitor currents in active power components in medium or high-powered devices, of the type comprising a current transformer core and a measuring core in which the current transformer core is a nanocrystalline core whose permeability μ lies between 200 and 1000.

13. A device according to claim 9, wherein the device is capable of measuring a current comprising a strong direct current component.

14. The device according to claim 11, further comprising a double stage energy meter comprising a current transformer core and a measuring core according to standard IEC 1036 for ratings over 50 A, in which the current transformer core is a nanocrystalline core whose permeability μ is below 800.

15. The device according to claim 12, wherein the device constitutes a current probe having a broad measurement dynamic to monitor currents in active power components in medium or high-powered devices, of the type comprising a current transformer core and a measuring core in which the current transformer core is a nanocrystalline core whose permeability μ is less than 800.

* * * * *